(12) United States Patent
Strzalkowski

(10) Patent No.: US 6,720,816 B2
(45) Date of Patent: Apr. 13, 2004

(54) INTEGRATABLE CIRCUIT CONFIGURATION FOR POTENTIAL-FREE SIGNAL TRANSMISSION

(75) Inventor: Bernhard Strzalkowski, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/365,040

(22) Filed: Feb. 12, 2003

(65) Prior Publication Data

US 2003/0151442 A1 Aug. 14, 2003

(30) Foreign Application Priority Data

Feb. 12, 2002 (DE) .......................... 102 05 705

(51) Int. Cl.[7] ................................. H03L 5/00
(52) U.S. Cl. ....................... 327/307; 327/306
(58) Field of Search ................ 327/300, 307, 327/306, 530, 190, 198, 50

(56) References Cited

U.S. PATENT DOCUMENTS

| | | | |
|---|---|---|---|
| 4,027,152 A | 5/1977 | Brown et al. | 455/612 |
| 5,952,849 A | 9/1999 | Haigh | 326/86 |
| 6,262,600 B1 | 7/2001 | Haigh et al. | 326/86 |

*Primary Examiner*—Dinh T. Le
(74) *Attorney, Agent, or Firm*—Laurence A. Greenberg; Werner H. Stemer; Ralph E. Locher

(57) ABSTRACT

A circuit configuration for potential-free signal transmission has a transformer with a primary winding and a secondary winding. A drive circuit is connected upstream of the primary winding and a selection circuit is connected up to the secondary winding and is driven by pulses. A latching circuit is connected downstream of the selection circuit and prevents a forwarding of second pulses under specific conditions. Finally, a storage element generates an output signal.

16 Claims, 4 Drawing Sheets

INTEGRATABLE CIRCUIT CONFIGURATION FOR POTENTIAL-FREE SIGNAL TRANSMISSION

BACKGROUND OF THE INVENTION

Field of the Invention

The invention relates to an integratable circuit configuration for potential-free signal transmission.

In industrial power electronics and systems engineering, for example, the control circuits and the power circuits often have to be DC-isolated from one another. The dictates of operation mean that the control circuits are subject to very great disturbances/interferences that lead to the malfunctioning or to the failure of the electrical system. The disturbances result from rapidly changing voltages and currents in the power circuit. In this way, very strong, rapidly changing electric (dU/dt) and magnetic (dΦ/dt) fields arise which permeate the control circuits and influence them. In this case, optocouplers or pulse transformers are usually used for DC isolation. In the event of very high-frequency changes in electric fields, displacement currents are impressed through parasitic coupling capacitances. The currents can lead to malfunctions of optocouplers or pulse transformers. Furthermore, strong magnetic fields, especially in the transformer windings, can additionally induce undesired interference voltages which likewise cause faults. Furthermore, optocouplers have the disadvantage of a high current consumption. Moreover, on account of their considerable external dimensions, both optocouplers and primarily pulse transformers are unsuitable or at least undesirable in many cases.

U.S. Pat. Nos. 6,262,600, 5,952,849 and 4,027,152 disclose transformer configurations that can be at least partly integrated in a semiconductor body. However, they require a high outlay on circuitry.

This is because the operating range of a transformer is restricted on account of parasitic effects at high and relatively low frequencies. Each transformer accordingly behaves like a bandpass filter. In this case, the operating frequency range depends to a very great extent on the construction and on the size of the transformer. The known planar transformers that are applied on the surface of a semiconductor chip have spiral windings and these windings, for their part, have a relatively high conductor track resistance. Therefore, the ratio of the self-inductance L of the winding to the resistance R thereof is unfavorable. The ratio of the two produces the time constant of the winding $T_p = L/R$. The time constant restricts the operating frequency of the transformer particularly at relatively low frequencies. By way of example, for planar transformers having external diameters of up to 500 μm, produced in a standard technology, the time constant lies in the range of 1–5 ns, that is to say that the minimum operating frequency (−3 dB) is 35 MHz to 165 MHz.

In order to transmit items of information by a transformer of this type, the signal duration must be of the order of magnitude of the time constant. However, this requires complicated high-frequency circuits in order to be able to generate the short pulses, because in the event of longer pulses the winding attains saturation, so that a transmission of information or energy is no longer possible.

SUMMARY OF THE INVENTION

It is accordingly an object of the invention to provide an integratable circuit configuration for potential-free signal transmission that overcomes the above-mentioned disadvantages of the prior art devices of this general type.

With the foregoing and other objects in view there is provided, in accordance with the invention, a circuit configuration for potential-free signal transmission. The circuit configuration contains a transformer having two windings magnetically coupled to one another. The two windings include a primary winding and a secondary winding. A drive circuit is connected upstream of the primary winding and converts edges of a logical input signal into primary-side pulses corresponding to the logical input signal. Each of the primary-side pulses in the primary winding generates in the secondary winding secondary pulses corresponding to the edges of the logical input signal. A selection circuit is connected up to the secondary winding. The selection circuit is driven by the secondary pulses and separates the secondary pulses according to a respective assignment to an edge of the logical input signal. A latching circuit is connected downstream of the selection circuit, the latching circuit compares separate ones of the secondary pulses with one another and prevents a forwarding of the secondary pulses in an event of separate ones of the secondary pulses occurring simultaneously and/or in an event of the secondary pulses occurring in short-time succession. A storage element is connected to the latching circuit. The storage element is set by the secondary pulses of a first polarity, is reset by the secondary pulses of a second polarity, and generates an output signal.

The transformer configuration according to the invention has the advantage that, in addition to the small dimensions, only a low outlay is required, only low power consumption exists, and the susceptibility to interference is low.

This is achieved by the circuit configuration having a transformer with two windings that are magnetically coupled to one another and of which one is provided as the primary winding and the other as the secondary winding. In this case, a drive circuit is connected upstream of the primary winding and converts edges of a logical input signal into primary-side pulses corresponding to the input signal. Each of the primary pulses in the primary winding generates secondary pulses that can be assigned to the edges of the input signal in the secondary winding. A selection circuit is connected up to the secondary winding, which selection circuit is driven by the secondary pulses and separates the secondary pulses according to a respective assignment to the edge of the input signal. Finally, a latching circuit is provided, which is downstream of the selection circuit, compares separate secondary pulses with one another and, in the event of separate secondary pulses occurring simultaneously and/or in the event of secondary pulses occurring in short-time succession, prevents a forwarding of the secondary pulses to a storage element which is set by secondary pulses of one polarity and is reset by secondary pulses of the other polarity and carries an output signal.

The duration of the pulses may be dimensioned in such a way that the transformer is operated in saturation.

During the linear operation of the transformer as in the prior art, the saturation state is prevented from being reached because no voltage is induced in the secondary winding. In the case of the customary signal transmission without saturation of the transformer, the pulse width of the output voltage is equal to the pulse width of the input voltage. The voltage waveform at the input and at the output is also approximately identical. The two signals are temporally coincident. In the case of the development of the invention, the problematic property of the very short time constant $T_p = L/R$ of the primary winding is utilized to the effect that, with each voltage pulse on the primary winding, two very short pulses of the opposite polarity and following very shortly one after another are induced in the secondary winding. The polarity of the output pulses is unambiguously assigned to the polarity of the edges of the input voltage, so that only a simple drive circuit and a simple evaluation circuit are necessary.

The above development of the invention is thus based on taking account of the properties of the planar transformer in a circuit that does not utilize the linear operating range of the transformer. This is achieved in particular by virtue of the fact that the maximum operating frequency of the electronic circuit that drives the transformer lies below the operating frequency range of the transformer. The drive and evaluation devices allow a faithful re-establishment of the information despite the different operating frequencies. Consequently, it is not necessary to use expensive high-frequency technology for the circuit in order to utilize the integrated planar transformer for the DC isolation of the signals.

In a development of the invention, a primary refresh pulse may be generated after each primary pulse generated, which refresh pulse, in the case of the circuit configuration not responding after the first pulse, then leads to a reliable response at the second attempt.

The selection circuit may have two comparators, to which, on the one hand, a reference potential is in each case applied, and which, on the other hand, are driven with the secondary pulses in an inverse manner with respect to one another.

In the case of the above-mentioned circuit configuration, two transformers may also be provided, of which two are provided as primary windings and two as secondary windings, each of the primary windings being magnetically coupled to a respective one of the secondary windings.

In this case, the drive circuit may be configured for driving the two primary windings, the drive circuit driving the two primary windings in an inverse manner with respect to one another or, in the event of a state change of the input signal occurring, driving one or the other primary winding depending on the direction of the state change.

Furthermore, the selection circuit may have four comparators, to which a reference potential is in each case applied, and which, are driven with the secondary pulses in pairs in an inverse manner with respect to one another. The outputs of the comparators of one pair are combined with the outputs of the other pair via a respective AND gate (or corresponding logic combinations).

The latching circuit may have two controllable switches, which are in each case connected downstream of the signal shapers (comparators), and are controlled by a coincidence circuit.

In this case, the coincidence circuit may determine the coincidence of signals occurring in the secondary windings and, in the event of coincident signals being present on both secondary windings, identifies an erroneous transmission and accordingly prevents the forwarding of the secondary pulses. As an alternative, it may determine the coincidence of secondary signals that are separated after the secondary windings and, in the event of coincident signals being present, correspondingly identifies an erroneous transmission.

The coincidence circuit preferably contains an AND gate or two timing elements cross-coupled to the switches for determining the coincidence.

In a refinement of the invention, the (respective) primary and secondary windings may be formed in different planes in the direction of the winding axes. Furthermore, the windings are preferably formed in a spiral shape or fashion.

Finally, the circuit configuration is partly or preferably completely integrated into a semiconductor body.

Other features which are considered as characteristic for the invention are set forth in the appended claims.

Although the invention is illustrated and described herein as embodied in an integratable circuit configuration for potential-free signal transmission, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
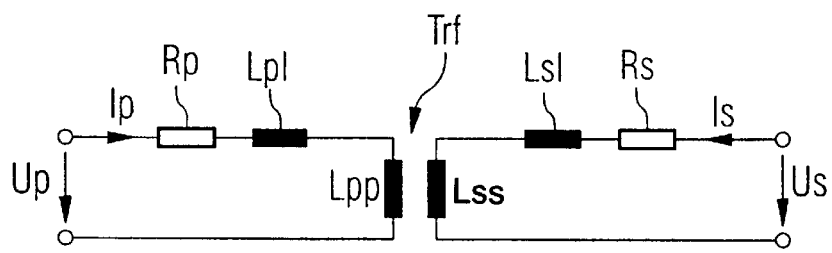
FIG. 1 is an equivalent circuit diagram of a customary transformer.
Figure 2:
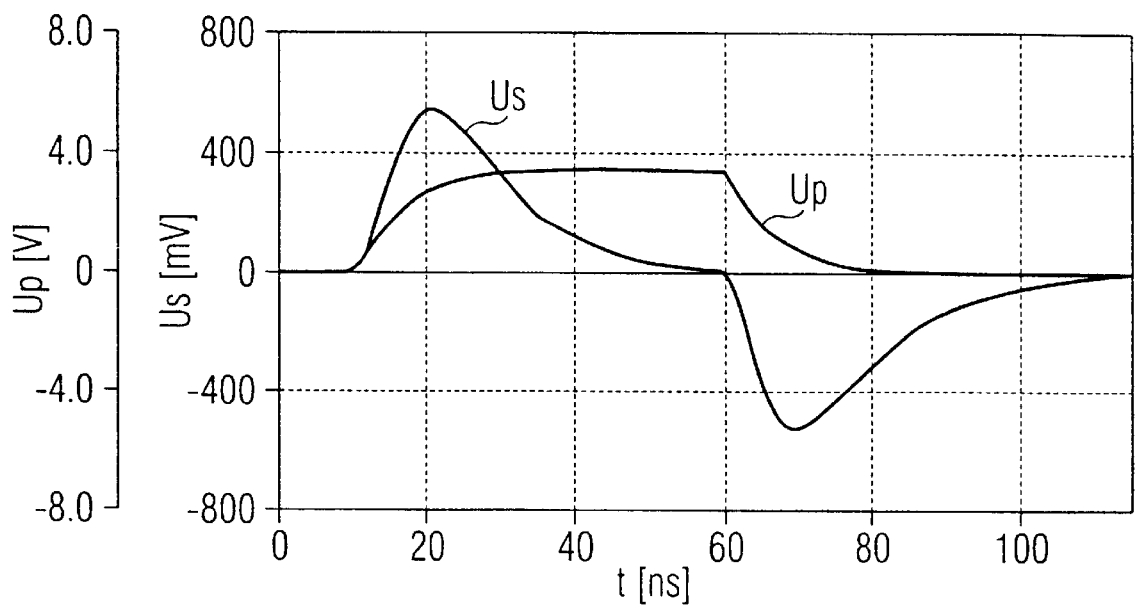
FIG. 2 is a graph showing a simulation of primary and secondary voltages in the case of a planar transformer.

Referring now to the figures of the drawing in detail and first, particularly, to FIGS. 1 and 2 thereof, there is shown in order to explain a signal transmission according to the invention, a simple equivalent circuit diagram of a transformer Trf and its voltage profiles. A primary voltage Up is fed into a series circuit containing a primary track resistance Rp, a primary line inductance Lpl and an inductance of a primary winding Lpp, producing a current Ip. On a secondary side, a voltage Us is generated therefrom in an inductance Lss, which voltage can be tapped off via a secondary track resistance Rs and a secondary line inductance Lsl as a secondary voltage Us and as secondary current Is.

FIG. 2 shows, in respect thereof, a profile of the primary and secondary voltages Up and Us of the planar transformer Trf in a saturation mode over time t. In the event of an exponential rise or fall in the primary voltage Up, an initial sharp rise with a subsequent fall can be seen in the case of the secondary voltage Us, in other words the secondary voltage Us does not correspond to the waveform of the primary voltage Up. Such a correspondence is only achieved in the linear region. The secondary voltage Us is induced only approximately during a time duration 3·Tp; afterward it falls to zero. The polarity of the secondary pulses corresponds to the polarity of the edges of the primary pulses.

Figure 3:
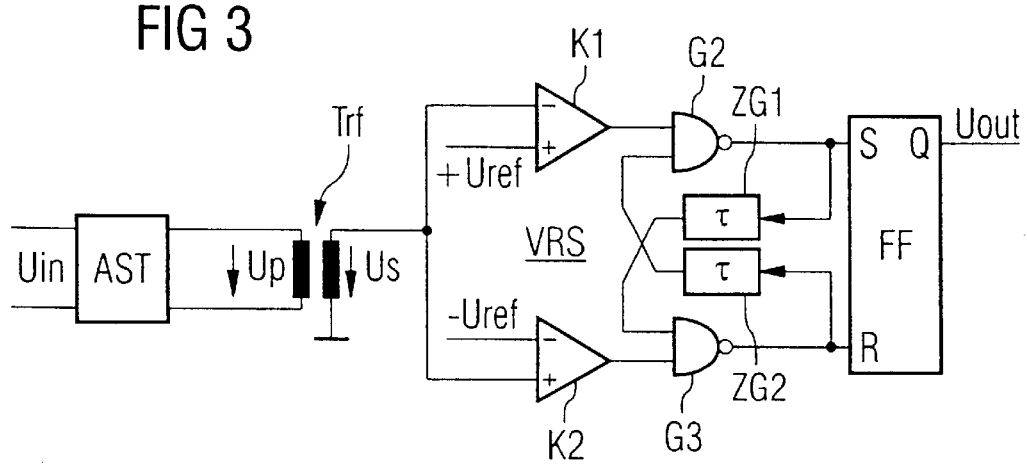
FIG. 3 is a circuit diagram of an embodiment of a circuit configuration according to the invention with a transformer.

In the exemplary embodiment shown in FIG. 3 and according to the invention, an input voltage Uin is fed to a drive circuit AST. The drive circuit AST contains a monostable multivibrator, for example, which, in response to a positive edge of the input voltage Uin, generates a positive pulse, that is to say a pulse of the voltage Up with a duration T. A negative edge of the input voltage Uin in turn causes a negative pulse, that is to say a pulse of the voltage –Up. An edge steepness and a duration of the pulses are determined by the maximum switching speed of the drive circuit AST.

Figure 4:
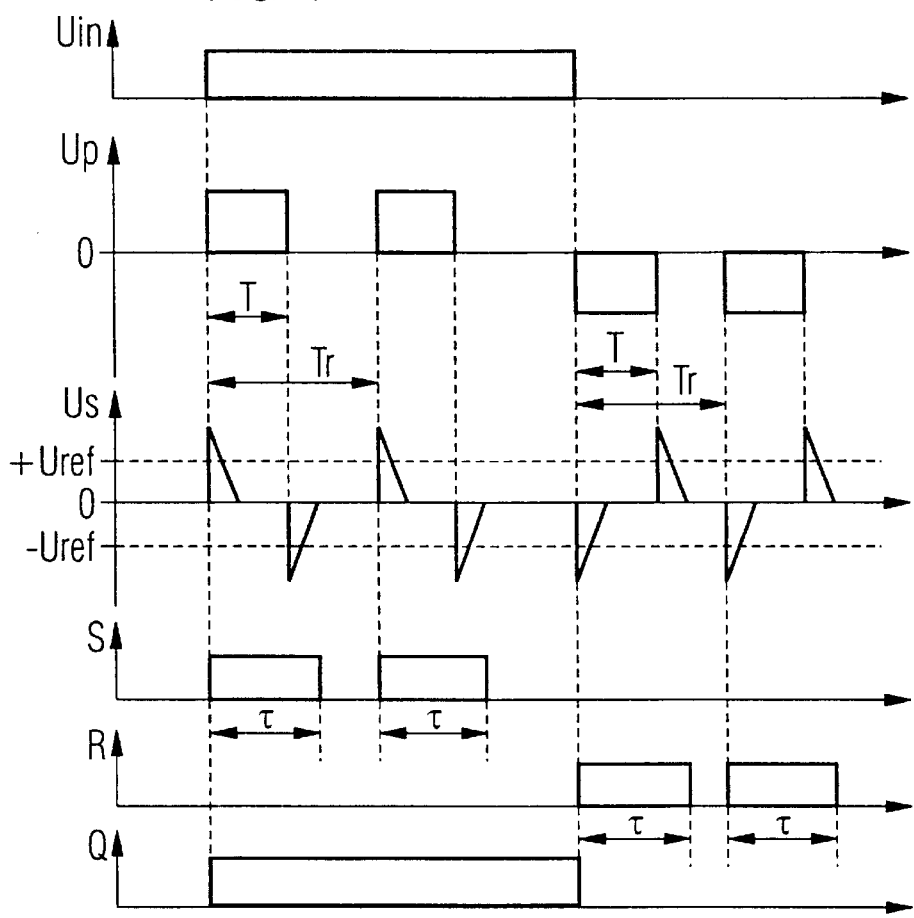
FIG. 4 is a graph of a profile of different signals in the case of the circuit configuration according to FIG. 3.

The planar transformer Trf converts the primary voltage Up originating from the input voltage Uin, as illustrated in FIG. 4, into at least two short successive pulses, which are compared with reference potentials +Uref and –Uref in two comparators K1 and K2 (in accordance with FIG. 3). The comparators K1 and K2 generate short pulses that are forwarded to a latching circuit VRS. The latching circuit VRS contains, by way of example, two NAND gates G2, G3 as controllable switches which, on the input side, are in each case connected to the output of one of the two comparators K1 and K2 and, via a timing element ZG1 and ZG2, respectively, for generating a delay time τ, to the output of the respective other NAND gate G3, G2. Finally, the NAND gates G2, G3 are followed by a storage element FF in the form of an RS flip-flop, in which a set input S is connected to an output of the gate G2 and a reset input R is connected to an output of the gate G3. An output voltage Uout can be tapped off at an output Q of the storage element FF.

The first arriving pulse (with positive polarity corresponding to the positive edge or negative polarity for the negative edge) latches the device for the delay time τ, so that the second subsequently arriving pulse is not forwarded to the inputs of the storage element FF. As a result, the storage element FF can only be triggered by the first pulse. In this way the profile of the input signal Uin is re-established in the output signal Uout.

In order to ensure the latching, the delay time τ must be longer than the duration T of the primary pulses of the voltage Up. In order to increase the reliability of the transmission, in the exemplary embodiment, refresh pulses are generated, these being generated at certain time intervals Tr in the first pulses. Both positive and negative refresh pulses are generated, their polarity depending on the state of the input voltage Uin.

Figure 5:
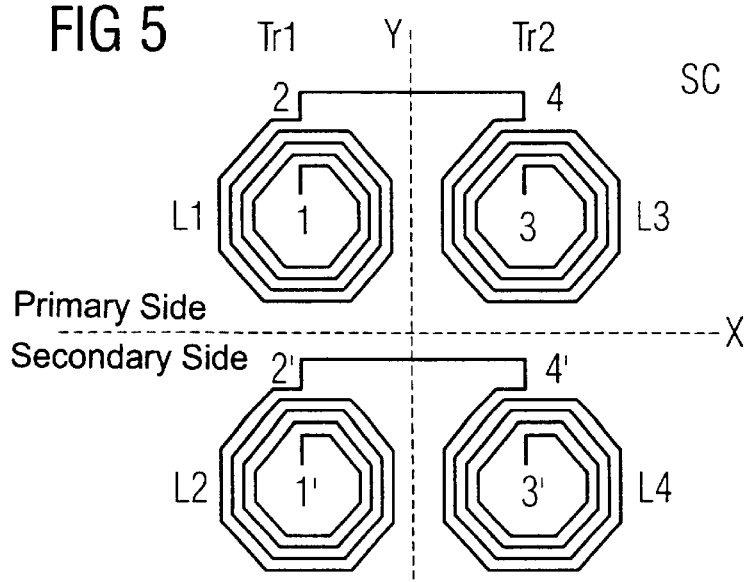
FIG. 5 is an illustration of a preferred construction of a transformer configuration in the case of a circuit configuration according to the invention.

In the case of the exemplary embodiment shown in FIG. 5, four identical spiral, planar coils L1, L2, L3, L4 are disposed in a square at the surface of a semiconductor body SC. The coils are realized as conductor strip structures in the semiconductor body SC, outer connections 2, 4 of the primary windings L1 and L3 being connected up to one another. Inner connections 1, 3 of the primary windings L1 and L3 are embodied as bonding pads, for example, and may accordingly serve for fixing bonding wires. In this case, the two identical primary windings L1 and L3 are disposed next to one another, that is to say in one plane, with respect to an axis Y. In the same way, two identical windings L2 and L4, which form the secondary windings, are disposed next to one another, that is to say in one plane, with respect to the axis Y in the direction of their coil axis. In this case, the two planes are in turn disposed one below the other. For the sake of greater clarity, in the drawing the planes are illustrated in a manner shifted (or folded upward) relative to one another about an axis X that runs at right angles to the axis Y and between the primary and secondary windings. In this case, outer connections 2', 4' of the secondary windings L2 and L4 (=transformer Tr2) are connected up to one another in the same way as in the case of the windings L1 and L3 (=transformer Tr1). The inner connections 1' and 3' are provided as outputs of the transformers.

Figure 6:
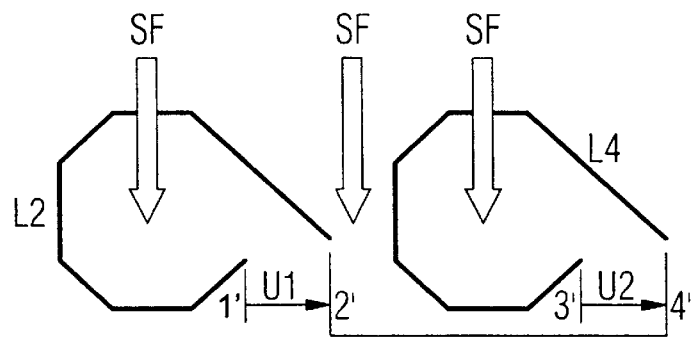
FIG. 6 is an illustration of a profile of interference fields acting on the secondary windings of the transformer configuration according to FIG. 5.
Figure 7:
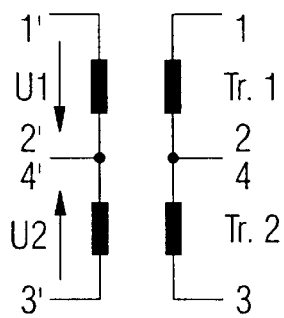
FIG. 7 is a circuit diagram showing the polarity of the voltages on the secondary windings of the transformer configuration of the invention in the event of the interference fields shown in FIG. 6 occurring.

FIG. 6 shows the action of an interference field SF on the secondary windings L2 and L4 and the resultant voltages at the winding ends 1', 2' and 3', 4', respectively. As can be seen, the interference field SF (dΦ/dt or dU/dt) causes two voltages U1, U2 of the same polarity at the winding ends 1', 2' and 3', 4', respectively. This effect is illustrated diagrammatically again in detail in FIG. 7.

Figure 8:
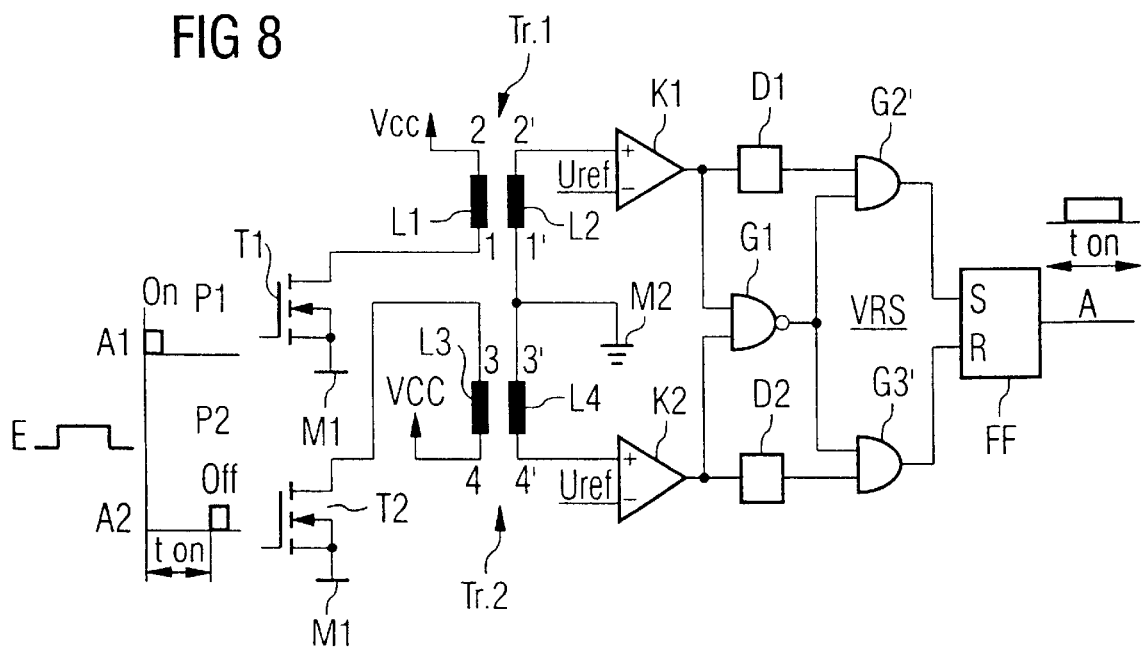
FIG. 8 is a circuit diagram of a first embodiment of a circuit configuration according to the invention with two transformers.

FIG. 8 illustrates a circuit configuration that exploits these facts. In order to transmit a logical input signal E as a pulse of a specific voltage and specific length, first a short pulse P1 characterizing a rising edge of the input signal E is generated on a first line A1, and a pulse P2 is correspondingly generated for a falling edge on a line A2. The distance between the two pulses P1 and P2 corresponds to a pulse duration t on of the input signal E.

The pulse P1 serves for driving a transistor T1 and the pulse P2 for driving a transistor T2. The controlled path of the transistor T1 is connected in series with the winding L1 in such a way that a source connection of the transistor T1 is connected up to a reference-ground potential M1, a drain connection of the transistor T1 is connected to the winding end 1 of the winding L1 and the winding end 2 of the winding L1 is connected to a reference-ground potential. In a corresponding manner, a source connection of the transistor T2 is connected to a reference-ground potential, a drain connection of the transistor T2 is connected to the winding end 3 of the winding L3 and the winding end 4 of the winding L3 is connected to the supply potential Vcc.

In the case of the winding L2 which is magnetically coupled to the winding L1, the winding end 2' is coupled to the non-inverting input of the comparator K1, which is formed as a signal shaper. The inverting input of the comparator K1 is connected to a reference potential Uref. In the same way, the winding end 4' of the winding L4 which is magnetically coupled to the winding L3 is connected to the non-inverting input of a comparator K2, which likewise serves as a signal shaper and whose inverting input is likewise connected to the reference potential Uref. The winding ends 1' and 3'—coupled to one another—of the windings L2 and L4 are connected to a further reference-ground potential M2.

The outputs of the comparators K1 and K2 are connected first in each case to one of the two inputs of a NAND gate G1 and second in each case via a delay element D1, D2 to an AND gate G2' and G3', respectively, the respective other input of the gates G2' and G3' being connected to an output of the gate G1. Finally, an RS flip-flop FF is also provided, at whose output an output signal A can be tapped off and whose set input S is connected up to the gate G2' and whose reset input R is connected up to the output of the gate G3'. The output signal A is then once again a pulse of length t on.

Useful signals that switch the transistors T1 and T2 on for only a very short time are conditioned in accordance with the positive or the negative edge of the useful signal. The transformer Tr1 with the windings L1 and L2 transmits the information when the output voltage rises. By contrast, the transformer Tr2 with the windings L3 and L4 transmits the information when the output voltage falls. The corresponding signals are then forwarded to the RS flip-flop FF, disturbances which become apparent on both transformers being blocked through the latching with the gates G1, G2' and G3'.

The invention thus provides small planar transformers that are integrated for example on the surface of an integrated circuit for control and/or switching purposes. The windings of the transformers are disposed in a spiral fashion. Two transformers are used for one transmission channel, while at least secondary windings are disposed in the same winding sense. Magnetic interference fields induce interference voltages that are in phase with respect to one another in the windings.

An uncomplicated electronic latching identifies the coincidence of the signals and thus identifies the state as a disturbance. The two transformers are configured to be largely identical and symmetrical, so that the disturbances resulting from high electrical interference fields (dU/dt) also have identical phases analogously to the magnetic disturbances. The latching also identifies this malfunction. The realization of an associated circuit configuration is very simple and efficient and requires only few functions. The driving of the transformers and the evaluation of the transmission signals are also effected in a unipolar manner, i.e. it is possible to use very simple circuits.

However, the invention differs significantly from the known differential transmission technology that is usually used to minimize disturbances. In the known differential transmission technology, too, two channels are used, but the useful signals always have opposite polarity in order to eliminate the common-mode interference. By contrast, in the case of the present configuration, only one pulse is generated per signal change and is also only transmitted via one channel. As a result, the driving and the evaluation of the signals are simpler than in the case of the method already known.

Figure 9:
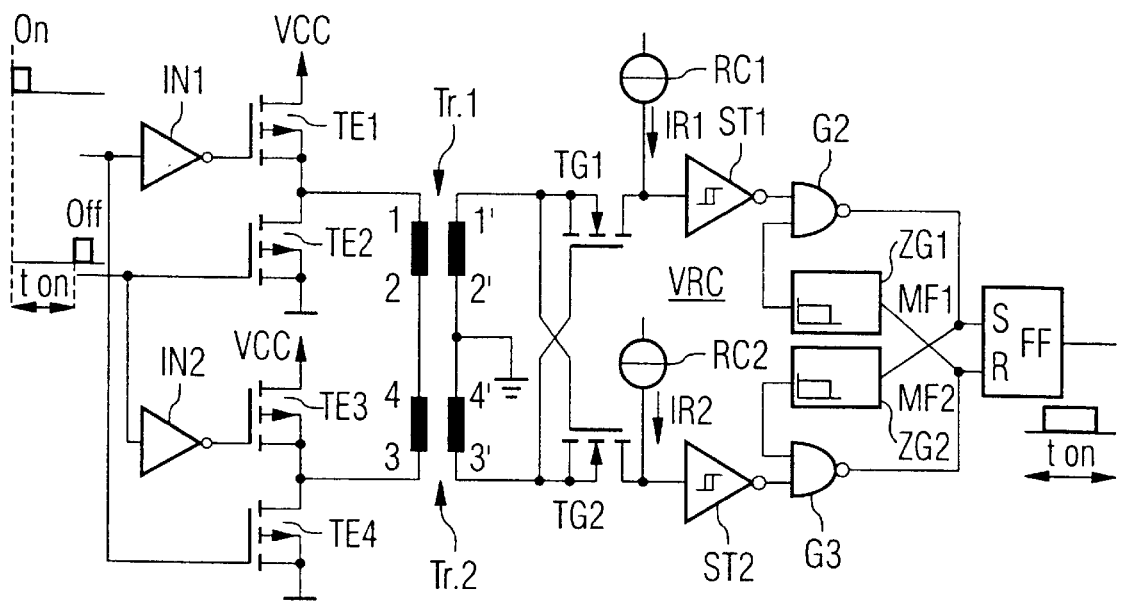
FIG. 9 is a circuit diagram of a second embodiment of the circuit configuration according to the invention with two transformers.

In the exemplary embodiment shown in FIG. 9, once again two transformers Tr1 and Tr2 as in FIG. 8 are used, but the connections 2 and 4 and the connections 2' and 4' are connected to one another. The connections 2' and 4' are furthermore connected to a secondary ground. In this case, the driving of the primary windings, which are connected in series, is driven by the drive switch circuit AST, and supplies the primary winding via a circuit, so that the operating voltage Vcc is utilized optimally. The bridge circuit contains two output stages each having two transistors TE1, TE2 and TE3 and TE4, respectively. The two output stages are configured to be identical, the load paths of the two transistors TE1 and TE2, and TE3 and TE4, respectively, in each case being connected in series between a primary ground and the supply potential Vcc. The connections 1 and 3 of the transformers Tr1 and Tr2, respectively, are connected to the respective tap of the transistors TE1, TE2 and TE3, TE4 respectively. In this case, the transistors TE1 and TE3 facing the supply potential Vcc are respectively driven via an inverter IN1 and IN2, while the remaining transistors TE2 and TE3 are driven directly by the output signal of the drive circuit AST. In this case, the individual output stages, for their part, are driven crosswise, i.e. inversely with respect to one another.

On the secondary side, the connections 1' and 3' of the transformers Tr1 and Tr2 are connected via the load paths of transistors TG1 and TG2 to a respective Schmitt trigger ST1 and ST2, a reference current IR1 and IR2, respectively, additionally being fed into the input of the Schmitt trigger by a reference current source RC1 and RC2, respectively. The outputs of the two Schmitt triggers ST1 and ST2 then serve for driving a latching circuit, downstream of which a storage element is connected. In this case, the latching circuit and the storage element FF are constructed in the same way as shown in FIG. 3 and have NAND gates G2 and G3, delay elements ZG1 and ZG2. The storage element FF is again formed by the RS flip-flop FF. The exemplary embodiment enables both differential and temporal latching.

Figure 10:
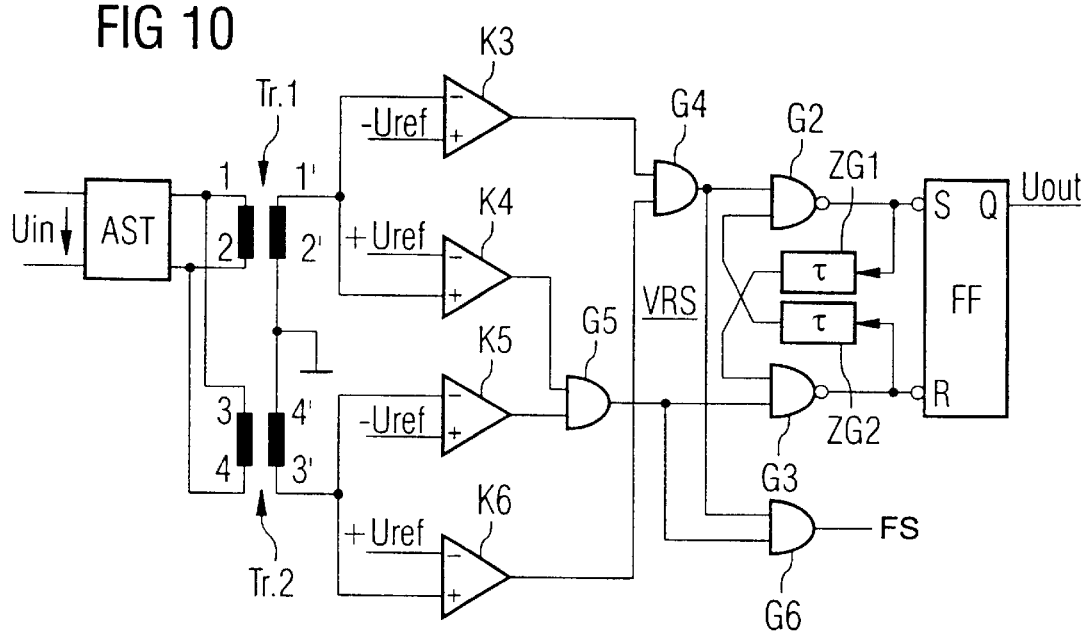
FIG. 10 is a circuit diagram of a third embodiment of the circuit configuration according to the invention with two transformers.

The exemplary embodiment shown in FIG. 10 emerges from the exemplary embodiment shown in FIG. 3 by the transformer Trf and the two comparators K1 and K2 being replaced by a configuration having the two transformers Tr1, Tr2 and four comparators K3 to K6 in conjunction with two AND gates G4 and G5. In this case, the transformers Tr1 and Tr2 may be formed as in the previous exemplary embodiments. In the present case, however, the primary windings are connected in parallel with one another in such a way that the connections 1 and 3, and 2 and 4 are in each case connected up to one another and are connected to the output of the drive circuit AST. By contrast, the secondary-side turns are connected up to one another, as in the exemplary embodiment according to FIG. 9, in such a way that the connections 2' and 4' are connected to one another and to a secondary ground. In this case, the connection 1' of the transformer Tr1 is connected to the inverting input of the comparator K3, whose non-inverting input is connected to the reference potential −Uref, and to the non-inverting input of the comparator K4, whose inverting input is connected to the reference potential +Uref. In an analogous manner, the connection 3' of the transformer Tr2 is connected to the inverting input of the comparator K5, whose non-inverting input is connected to the reference potential −Uref, and to the non-inverting input of the comparator K6, whose inverting input is connected to the reference potential +Uref. In this case, the outputs of the comparators K4 and K5 are connected to inputs of a gate G5, while outputs of the comparators K3 and K6 are connected to the inputs of the gate G4. The outputs of the gates G4 and G5 then serve for driving the latching circuit VRS, which, for its part, controls the inverting reset and set inputs RS of the flip-flop FF.

Finally, an AND gate G6 is also provided, whose inputs are connected to the outputs of the gates G4 and G5 and at whose output a signal FS can be tapped off, which can be used to indicate an erroneous transmission.

I claim:

1. A circuit configuration for potential-free signal transmission, comprising:

a transformer having two windings magnetically coupled to one another, said two windings including a primary winding and a secondary winding;

a drive circuit connected upstream of said primary winding and converts edges of a logical input signal into primary-side pulses corresponding to the logical input signal, each of the primary-side pulses in said primary winding generating in said secondary winding secondary pulses corresponding to the edges of the logical input signal;

a selection circuit connected up to said secondary winding, said selection circuit driven by the secondary pulses and separates the secondary pulses according to a respective assignment to an edge of the logical input signal;

a latching circuit connected downstream of said selection circuit, said latching circuit comparing separate ones of the secondary pulses with one another and prevents a forwarding of the secondary pulses in an event of separate ones of the secondary pulses occurring simultaneously and/or in an event of the secondary pulses occurring in short-time succession; and a storage element connected to said latching circuit, said storage element being set by the secondary pulses of a first polarity, being reset by the secondary pulses of a second polarity, and generates an output signal.

2. The circuit configuration according to claim 1, wherein a duration of the pulses is dimensioned such that said transformer is operated in saturation.

3. The circuit configuration according to claim 1, wherein a primary refresh pulse is generated for each primary-side pulse generated.

4. The circuit configuration according to claim 1, wherein said selection circuit has two comparators each receiving a reference potential and driven with the secondary pulses in an inverse manner with respect to one another.

5. The circuit configuration according to claim 4, further comprising a further transformer having a further primary winding and a further secondary winding magnetically coupled to said further primary winding.

6. The circuit configuration according to claim 5, wherein said drive circuit driving both said primary winding and said further primary windings, said drive circuit driving said primary winding and said further primary winding in an inverse manner with respect to one another.

7. The circuit configuration according to claim 5, wherein said drive circuit driving said primary winding and said further primary windings, said drive circuit, in an event of a state change of the logical input signal occurring, driving only one of said primary winding and said further primary winding, depending on a direction of the state change.

8. The circuit configuration according to claim 1,
further comprising a further transformer having a further primary winding and a further secondary winding magnetically coupled to said further primary winding;
further comprising AND gates; and
wherein said selection circuit has four comparators with outputs connected to said AND gates, each of said four comparators receiving a reference potential and receiving and driven by the secondary pulses in pairs in an inverse manner with respect to one another, one of said outputs of said comparators of one pair being combined with one of said outputs of the other pair through a respective one of said AND gates.

9. The circuit configuration according to claim 5, wherein said latching circuit has two controllable switches and a coincidence circuit, each of said controllable switches coupled downstream of one of said comparators and connected to and controlled by said coincidence circuit.

10. The circuit configuration according to claim 9, wherein said coincidence circuit determines a coincidence of signals occurring in said secondary windings and, in an event of coincidental signals being present on both of said secondary winding and said further secondary windings, said coincidence circuit identifying an erroneous transmission and accordingly prevents a forwarding of the secondary pulses.

11. The circuit configuration according to claim 9, wherein said coincidence circuit determines a coincidence of separate secondary pulses and, in an event of coincidental signals being present, identifies an erroneous transmission and accordingly prevents a forwarding of the secondary pulses.

12. The circuit configuration according to claim 10, wherein said coincidence circuit has an AND gate for determining a coincidence.

13. The circuit configuration according to claim 10, wherein said coincidence circuit has two timing elements cross-coupled to said controllable switches for determining a coincidence.

14. The circuit configuration according to claim 4, wherein each of said primary winding, said further primary winding, said secondary winding and said further secondary winding is formed in different planes in a direction of a winding axes.

15. The circuit configuration according to claim 1, wherein said primary winding, said further primary winding, said secondary winding and said further secondary winding are each formed in a spiral shape.

16. An integrated configuration, comprising:
a semiconductor body; and
a circuit configuration for potential-free signal transmission completely integrated into said semiconductor body, said circuit configuration including:
a transformer having two windings magnetically coupled to one another, said two windings including a primary winding and a secondary winding;
a drive circuit connected upstream of said primary winding and converts edges of a logical input signal into primary-side pulses corresponding to the logical input signal, each of the primary-side pulses in said primary winding generating in said secondary winding secondary pulses corresponding to the edges of the logical input signal;
a selection circuit connected up to said secondary winding, said selection circuit driven by the secondary pulses and separates the secondary pulses according to a respective assignment to an edge of the logical input signal;
a latching circuit connected downstream of said selection circuit, said latching circuit comparing separate ones of the secondary pulses with one another and prevents a forwarding of the secondary pulses in an event of separate ones of the secondary pulses occurring simultaneously and/or in an event of the secondary pulses occurring in short-time succession; and
a storage element connected to said latching circuit, said storage element being set by the secondary pulses of a first polarity, being reset by the secondary pulses of a second polarity, and generates an output signal.

* * * * *